United States Patent
Hwei

(10) Patent No.: US 7,561,480 B2
(45) Date of Patent: Jul. 14, 2009

(54) GROUND BIASED BITLINE REGISTER FILE

(75) Inventor: Tan Soon Hwei, Buloh (MY)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 11/821,364

(22) Filed: Jun. 22, 2007

(65) Prior Publication Data

US 2008/0316836 A1    Dec. 25, 2008

(51) Int. Cl.
*G11C 7/00* (2006.01)
*G11C 11/00* (2006.01)
*G11C 7/10* (2006.01)

(52) U.S. Cl. ............. 365/189.11; 365/154; 365/189.05; 365/205

(58) Field of Classification Search ................. 365/154, 365/189.05, 189.11, 205
See application file for complete search history.

(56) References Cited

U.S. PATENT DOCUMENTS

| | | | | |
|---|---|---|---|---|
| 5,365,483 A | * | 11/1994 | Vinal | 365/203 |
| 5,602,774 A | * | 2/1997 | Elrabaa et al. | 365/177 |
| 5,798,972 A | * | 8/1998 | Lao et al. | 365/189.11 |
| 5,870,338 A | * | 2/1999 | Casper | 365/189.14 |
| 5,949,721 A | * | 9/1999 | Kwon et al. | 365/189.11 |
| 6,160,742 A | * | 12/2000 | Chung et al. | 365/189.05 |
| 6,349,054 B1 | * | 2/2002 | Hidaka | 365/173 |
| 6,683,804 B1 | * | 1/2004 | Eby et al. | 365/154 |
| 7,170,814 B2 | * | 1/2007 | Morikawa | 365/230.05 |
| 2003/0025122 A1 | * | 2/2003 | Nakamura et al. | 257/100 |
| 2007/0091670 A1 | * | 4/2007 | Hidaka | 365/158 |

* cited by examiner

*Primary Examiner*—Ly D Pham
(74) *Attorney, Agent, or Firm*—Ryder IP Law; Douglas J. Ryder

(57) ABSTRACT

In general, in one aspect, the disclosure describes an apparatus including a memory cell. Ground biased write control circuitry is used to bias write and writebar bitlines when the memory cell is not performing a write operation. Ground biased read control circuitry is used to bias a read bitline when the memory cell is not performing a read operation.

19 Claims, 5 Drawing Sheets

GROUND BIASED BITLINE REGISTER FILE

BACKGROUND

A register file is an array of processor registers (memory cells, bit cells) in a central processing unit (CPU). Modern integrated circuit-based register files may be implemented by way of fast static random access memories (SRAMs) with multiple ports having dedicated read and write ports. The memory cells may operate by discharging read and write bitlines to ground level during read and write operations respectively. The read and write bitlines may be precharged to a voltage source (Vcc) level after every operation and may be maintained at Vcc even in IDLE mode. Maintaining bitlines at Vcc level results in the register file suffering high leakage current. Discharging and precharging bitlines in full-swing to perform read/write operations requires high active power for the register file.

FIG. 1 illustrates an example memory cell 100 (e.g., 8 transistor memory cell). The memory cell 100 includes first and second transistors 110, 120 coupled together in series and third and fourth transistors 130, 140 coupled in series. Both series stacks are coupled between ground and Vcc and are cross coupled to one another (gate to source/drain connection). The first and third transistors 110, 130 may be positive channel transistors (e.g., PMOS) while the second and fourth transistors 120, 140 may be negative channel transistors (e.g., NMOS). The memory cell 100 also includes a fifth and sixth transistor 150, 160 coupled to the gates of the first series stack 110/120 and the second series stack 130/140 respectively. The fifth and sixth transistors 150, 160 are coupled to write wordline (gates) and write or writebar bitlines respectively. The transistors 150, 160 act as pass gates for writing data to the memory cell 100. When the memory cell is not in write mode (idle or read mode) the bitlines are tied high (Vcc). When the memory cell 100 is in write mode the write wordline is activated (set high) and the appropriate bitline (write or writebar) is discharged (set low) to write the appropriate bit to the memory cell 100.

The memory cell 100 further included seventh and eight transistors 170, 180 coupled together in series. The transistor 170 is coupled to read wordline and read bitline. When the memory cell 100 is not in read mode (idle or write mode) the read bitline is tied high. When the memory cell 100 is in read mode the read wordline is activated (set high) and the read bitline is discharged (set low) so that the data can be read from the memory cell 100.

BRIEF DESCRIPTION OF THE DRAWINGS

The features and advantages of the various embodiments will become apparent from the following detailed description in which.

DETAILED DESCRIPTION

Figure 1:
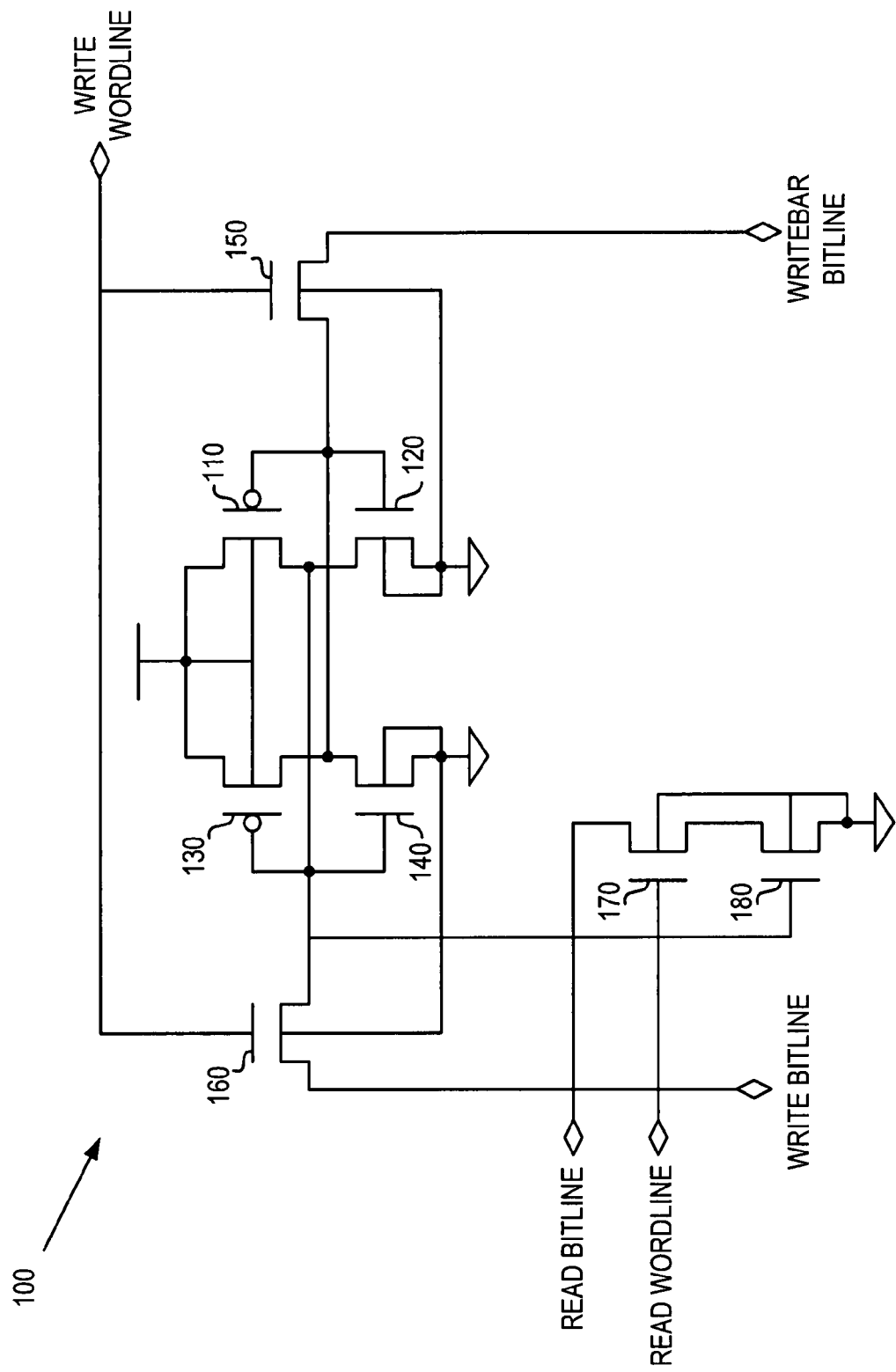
FIG. 1 illustrates an example memory cell, according to one embodiment.
Figure 2:
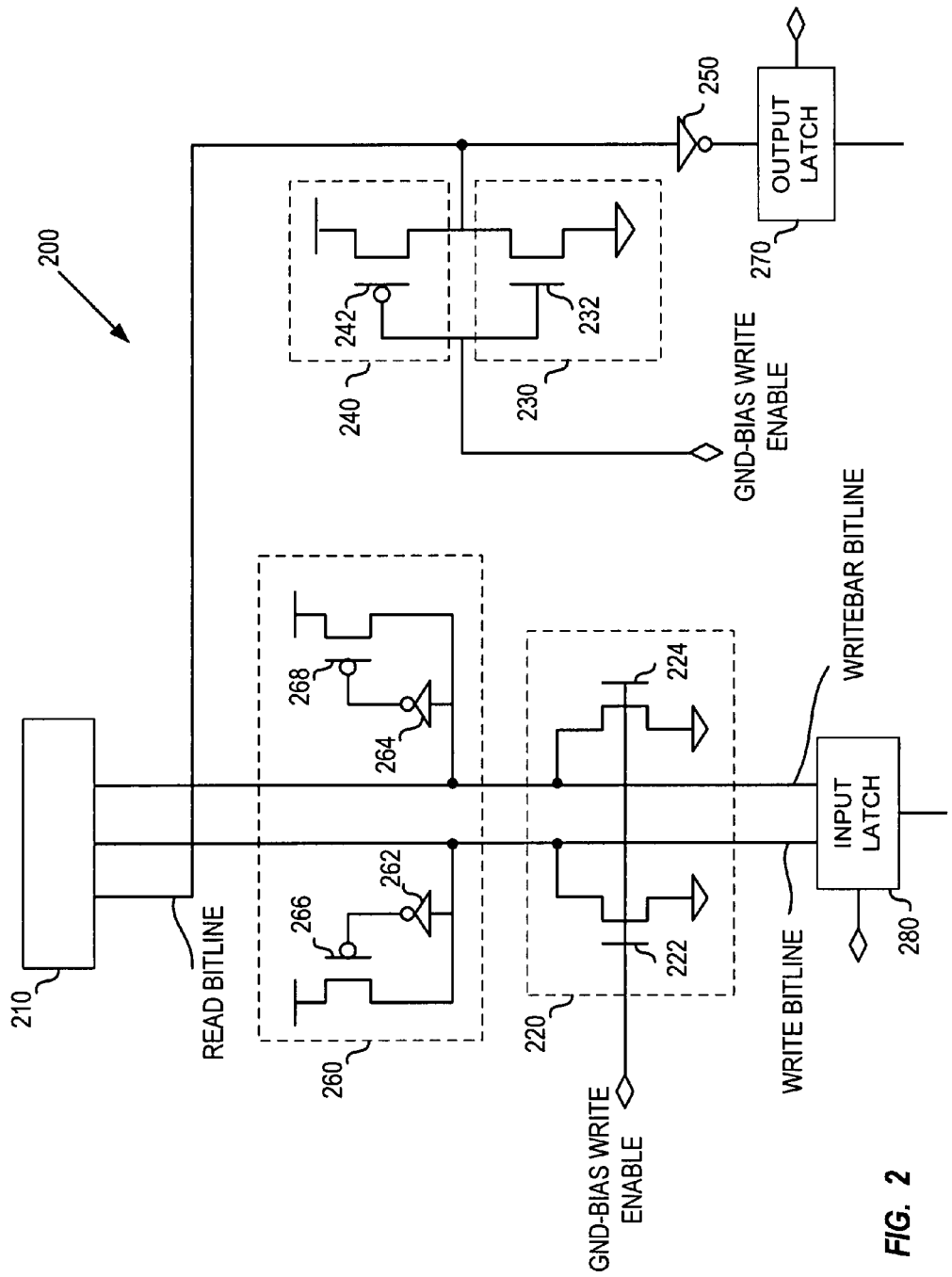
FIG. 2 illustrates an example ground biased memory system, according to one embodiment.

FIG. 2 illustrates an example ground biased memory system 200 (e.g., file register). The system 200 includes a memory cell 210 (e.g., 100 of FIG. 1), ground biased write control circuitry 220, ground biased read control circuitry 230, read bit-line sense control circuitry 240, skewed output inverter 250, and write bitline keeper 260

The ground biased write control circuitry 220 is used to ensure that write and writebar bitlines are biased at GND level when bits are not being written to the memory cell 210 (either in IDLE mode or READ mode). The ground biased write control circuitry 220 may be controlled by a ground biased write enable signal (e.g., inverted write enable signal). The ground biased write control circuitry 220 may include first and second transistors 222, 224 coupled in a shunt configuration to the write bitline and the writebar bitline respectively. The first and second transistors 222, 224 may be negative channel transistors (e.g., NMOS). The first and second transistors 222, 224 may receive the ground biased write enable signal (at their gates) and bias the bitlines to ground when the signal is active (no writing).

The ground biased read control circuitry 230 is used to ensure that read bitline is biased at GND level when bits are not being read from the memory cell 210 (either in IDLE mode or WRITE mode). The ground biased read control circuitry 230 may be controlled by a ground biased read enable signal (e.g., inverted read enable signal). The ground biased read control circuitry 230 may include a transistor 232 coupled in a shunt configuration to the read bitline. The transistor 232 may be negative channel transistor (e.g., NMOS). The transistor 232 may receive the ground biased read enable signal (at gate) and bias the bitline to ground when the signal is active (no reading).

The read bitline sense control circuitry 240 is used to sense the read bitline during read operation. The read bitline sense control circuitry 240 may be controlled by the ground biased read enable signal. The read bitline sense control circuitry 240 may include a transistor 242 coupled to the read bitline and a voltage source node (e.g., Vcc). The transistor 242 may be positive channel transistor (e.g., PMOS). The transistor 242 may receive the ground biased read enable signal (at gate) and be activated for sensing the read bitline when the ground biased read enable signal is inactive (reading is occurring).

The skewed output inverter 250 receives the signal read from memory cell 210 via the read bitline and inverts the data when the data exceeds a defined trip-point voltage. The inverted data may be provided to an output latch 270. The output latch 270 may output the data based on a latch enable signal.

The write bitline keeper 260 is used to maintain the write bitline or the writebar bitline that was active in order to write data to the memory cell 210 at a predetermined voltage level (e.g., Vcc) during consecutive write cycles. The write bitline keeper 260 may include inverters 262, 264 and transistors 266, 268 coupled between the write bitline or writebar bitline and a voltage source node (e.g., Vcc) respectively.

Figure 3:
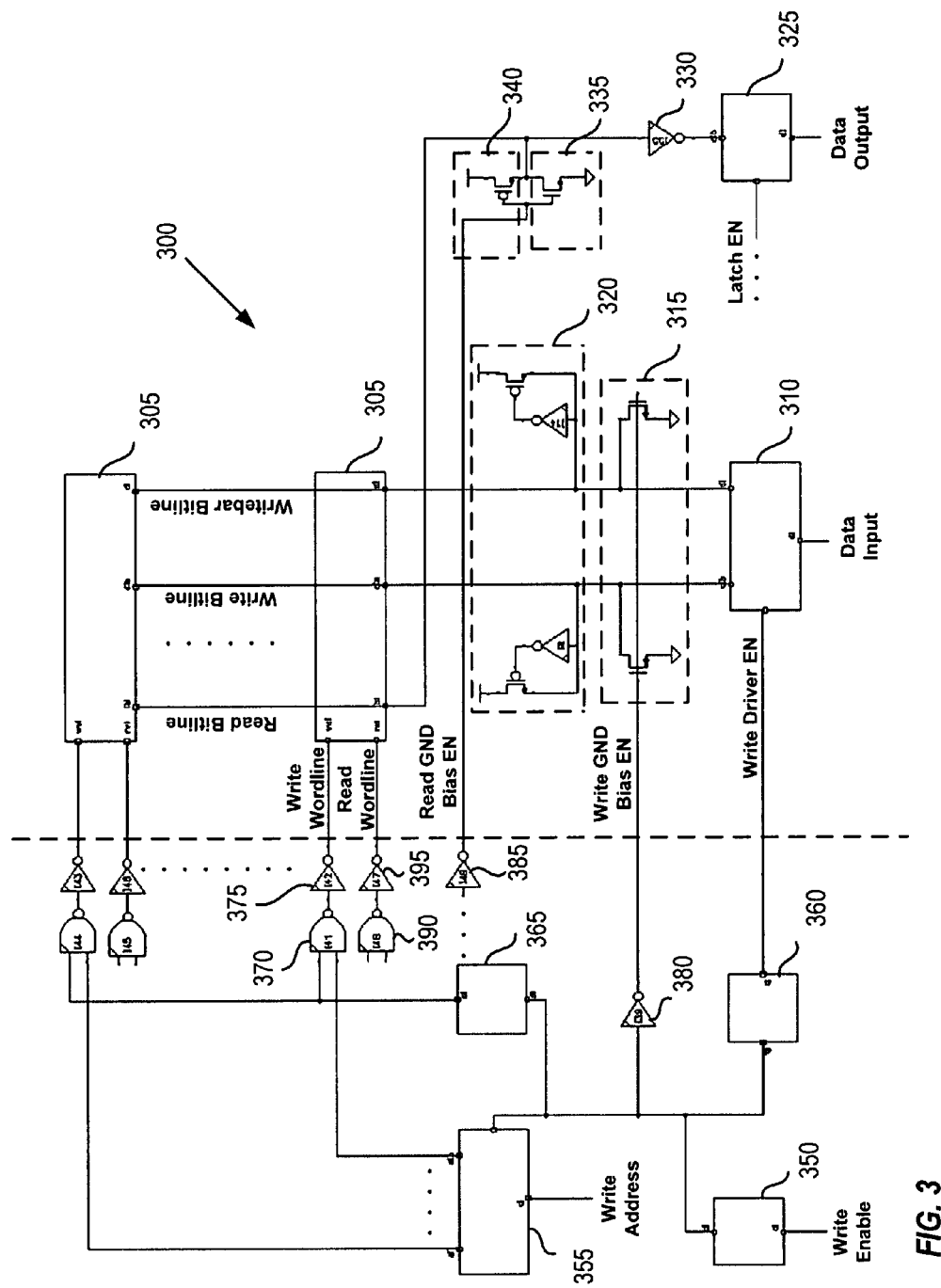
FIG. 3 illustrates an example ground biased register file, according to one embodiment.

FIG. 3 illustrates an example ground biased register file 300. The register file 300 includes data architecture circuitry (right side) and timing architecture circuitry (left side). The data architecture circuitry includes a plurality of memory cells 305 (e.g., 100, 210), a data input driver (e.g., positive edge flip-flops) 310, ground biased write control circuitry 315 (e.g., 220), write bitline keeper 320 (e.g., 260), output latch 325, output inverter 330 (e.g., 250), ground biased read control circuitry 335 (e.g., 230), and read bit-line sense control circuitry 340 (e.g., 240). The function of each of these devices is the same or similar to the corresponding devices discussed with respect to FIG. 2 above.

The timing architecture circuitry includes a write enable flip-flop 350, a write address row decoder flip-flop 355, low phase timing logics 360, 365, inverters 370, 375, 380, and NAND gates 385. The timing architecture also includes a read address row decoder flip-flop, a read enable flip-flop, inverters and NAND gates (not illustrated).

The write enable flip-flop 350 receives a write enable signal when the register file 300 is in write mode and enables writing by activating the enable signal on the positive edge of a clock signal. The row decoder 355 receives write addresses associated with memory cells 305 to have bits written thereto and activates associated write wordlines (rows). The row decoder 350 activates the write wordlines on the positive edge of the enable signal. The low phase timing logics 360, 365 receive the enable signal from the write enable flip flop 350 and activates a write driver enable signal and a write wordline enable signal respectively on the low phase of the clock (when the clock signal is in a high phase the enable signals are inactive). It should be noted that the low phase timing logics 360, 365 are illustrated as separate devices but may in fact be the same device.

The write driver enable signal is provided to data input driver 310. The data input driver 310 receives input data for writing and activates the appropriate bitline (write or writebar) based on the input data when the write driver enable signal is active (the write enable signal clocks the data in).

The write wordline enable signal is provided to NAND gates 370 associated with each memory cell 305. The NAND gates also receive the associated write wordline for each memory cell 305. The result of the NAND gates 370 are run through the inverters 375 and then provided to the memory cell 305. When both signals are active an active signal is provided to the memory cell 305. It should be noted that the NAND gates 370 and inverters 375 could be replaced with AND gates or other circuitry (write wordline activation circuitry).

The write enable signal is inverted (e.g., by the inverter 380) to produce the write ground biased enable signal that is provided to the ground biased write control circuitry 315. The write ground biased enable signal drives the write/writebar bitlines to ground when no writing is occurring.

While the logic for generating a read enable signal is not illustrated (e.g., read enable flip-flop), the read enable signal would be inverted (e.g., by the inverter 385) to produce the read ground biased enable signal that is provided to the ground biased read control circuitry 335 and the read bit-line sense control circuitry 340. The read ground biased enable signal drives the read bitline to ground when no reading is occurring (by activating the ground biased read control circuitry 335) and helps sense the read output (by activating the read bit-line sense control circuitry 340) when reading is occurring.

While the logic for activating the appropriate read wordlines is not illustrated (e.g., read address row decoder), the read wordline signals would be provided, along with the read enable signal, to read wordline activation circuitry (e.g., NAND gates 390 and inverters 395) for the associated memory cells 305.

Figure 4:
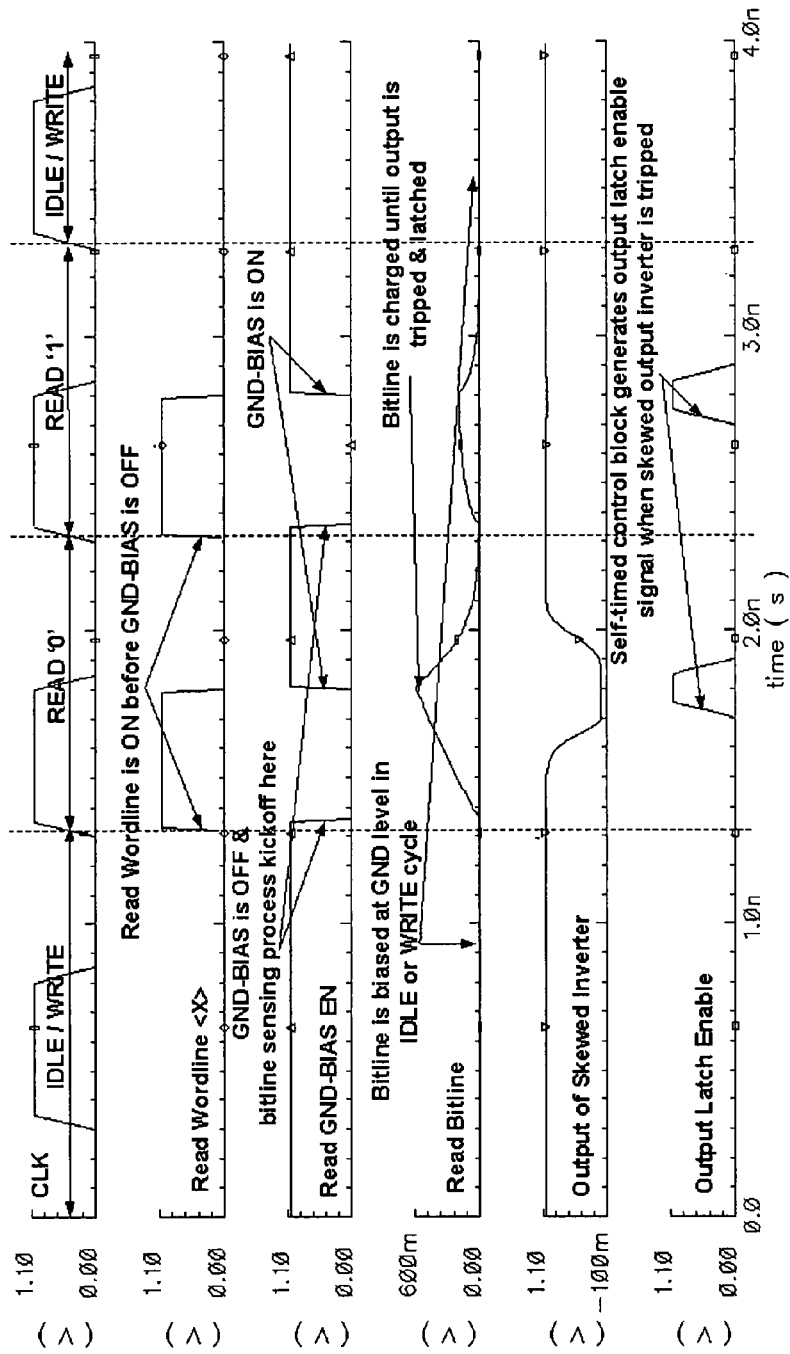
FIG. 4 illustrates an example read operation for a ground biased register file, according to one embodiment.

FIG. 4 illustrates an example read operation for a ground biased register file (e.g., 300). When discussing the read operation and the various signals associated therewith reference will be made to components of the ground biased register file 300 from FIG. 3. During non-reading periods (e.g., write, idol), the read wordline signals provided to the associated bit cells 305 are inactive (e.g., low, logic 0) and the read ground bias enable signal is active (e.g., high, logic 1). The active read ground biased enable signal turns ON the ground biased read control circuitry 335 and turns OFF the read bit-line sense control circuitry 340 so that the read bitline is biased to ground. Since the read bitline is biased to ground the output of the inverter 330 will be high.

During reading periods, the read wordline signals provided to the associated bit cells 305 are activated to turn ON the bitcell read ports. Then, the read ground biased enable signal is deactivated and the deactivated read ground biased enable signal turns OFF the ground biased read control circuitry 335 and turns ON the read bit-line sense control circuitry 340 to start bitline sensing process. When a '0' is being read, current from the read bit-line sense control circuitry 340 charges up the read bitline capacitance. The read bitline is charged until the inverter 330 trips (the trip value is met). The output of the inverter 330 at that point will be zero. The inverter output is provided to the output latch 335 which outputs the data when a latch enable signal is received. The latch enable signal may be generated by a self-timed control block based on the end of the read cycle (when clock returns to low phase). The latch enable signal may coincide with the timing of the inverter 330 being tripped when reading a '0'.

When a '1' is being read, current from the read bit-line sense control circuitry 340 flows into the bitcell 305 and the read bitline stays at a voltage level near to ground. When the enable signal is activated (e.g., by the self-timed control block) the inverter 330 has not tripped so the latch 335 outputs the '0'.

After the output data (either '0' or '1') is latched, the read wordline signal is turned OFF and the read ground bias enable signal is turned ON so that the read bitline is again biased at GND level.

Figure 5:
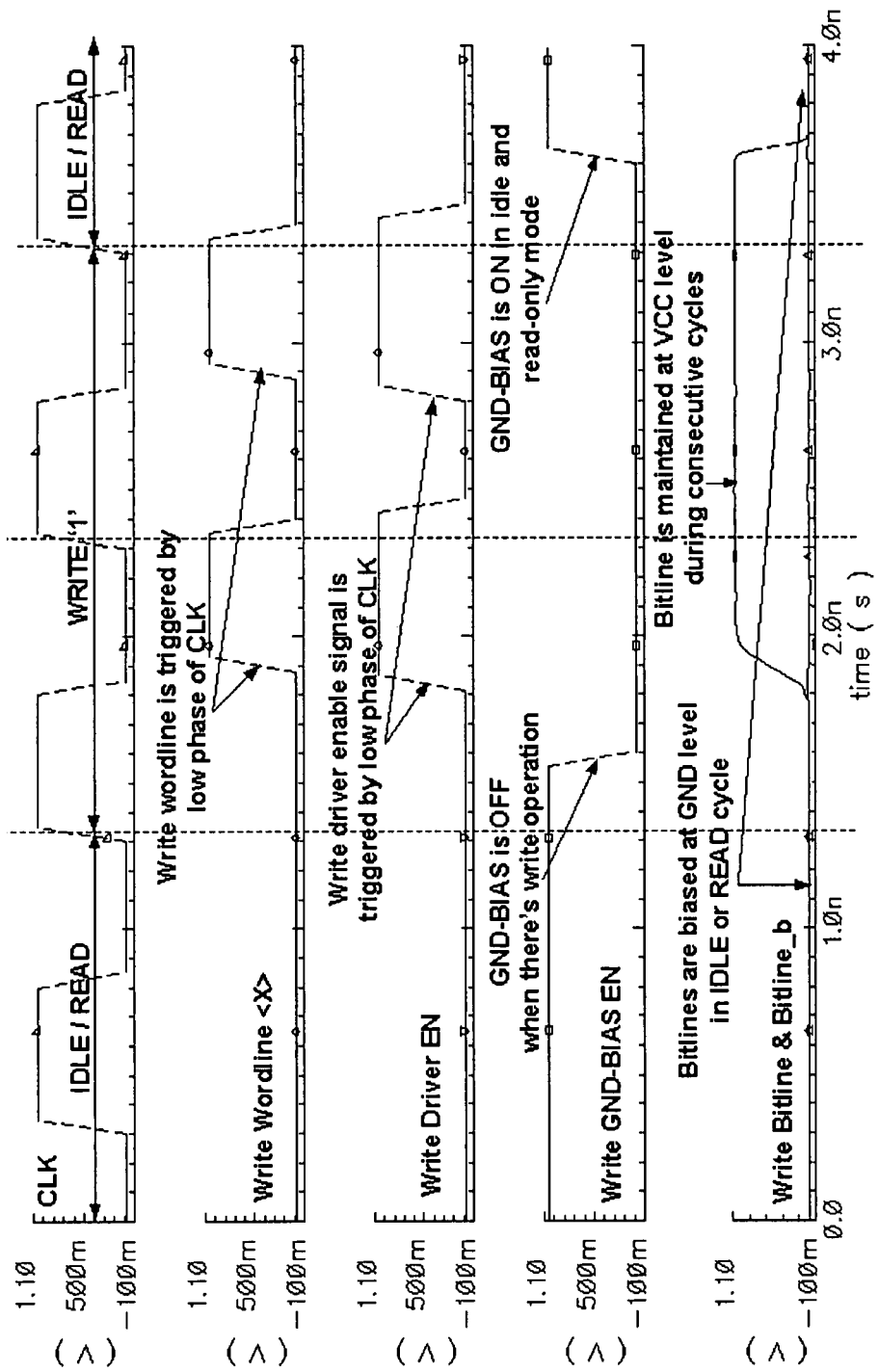
FIG. 5 illustrates an example write operation for a ground biased register file, according to one embodiment.

FIG. 5 illustrates an example write operation for a ground biased register file (e.g., 300). When discussing the write operation and the various signals associated therewith reference will be made to components of the ground biased register file 300 from FIG. 3. During non-writing periods (e.g., read, idol), the write wordline signals provided to the associated bit cells 305 and the write driver enable signal provided to the data input driver 310 are inactive and the write ground bias enable signal is active. The active write ground biased enable signal turns on the ground biased write control circuitry 315 which biases the write/writebar bitlines to ground.

During a write period, the row decoder 355 completes a decoding process within a high phase of the clock. During the low phase of the clock, the appropriate write wordline signals and the write driver enable signal are turned ON and the write ground bias signal is turned OFF. The inactive write ground bias signal turns off the ground biased write control circuitry 315 so that the bitlines are not biased to ground and the active write driver enable signal enables the input latch 310 to power the appropriate write/writebar bitline to Vcc. The active write wordline and the active write/writebar bitline turn ON the bitcell passgates (e.g., 150, 160) and the appropriate value is written to the bitcell 305. If the same data is written to the same column during consecutive write cycles, the keeper 320 maintains the appropriate write/writebar bitline at the same voltage level as the previous cycle (no precharge is performed and GND-bias is OFF). Thus, memory consumes less write power as bitlines are not being charged or discharged.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a memory cell;
ground biased write control circuitry to bias write and writebar bitlines to ground when the memory cell is not performing a write operation;
ground biased read control circuitry to bias a read bitline to ground when the memory cell is not performing a read operation; and
a write bitline keeper to maintain one of the write and writebar bitlines at a predetermined voltage during consecutive write cycles.

2. The apparatus of claim 1, wherein the ground biased write control circuitry includes a first transistor coupled between the write bitline and ground and a second transistor coupled between the writebar bitline and ground.

3. The apparatus of claim 2, wherein the first and second transistors are negative channel transistors.

4. The apparatus of 1, wherein the ground biased read control circuitry includes a transistor coupled between the read bitline and ground.

5. The apparatus of claim 4, wherein the transistor is a negative channel transistor.

6. The apparatus of claim 1, further comprising read bitline sense control circuitry to sense the value stored in the memory cell during read operations.

7. The apparatus of claim 6, wherein the read bitline sense control circuitry includes a transistor coupled between the read bitline and a voltage source node.

8. The apparatus of claim 7, wherein the transistor is a positive channel transistor.

9. The apparatus of claim 1, wherein the write bitline keeper includes a first inverter and a first transistor coupled between the write bitline and a predetermined voltage node and a second inverter and a second transistor coupled between the writebar bitline and the predetermined voltage node.

10. The apparatus of claim 9, wherein the first transistor and the second transistor are positive channel transistors.

11. An apparatus comprising
a plurality of memory cells;
timing architecture circuitry to receive read and write enable signals and read and write memory addresses and to enable appropriate ones of the memory cells for reading or writing based thereon;
a data input latch to receive data and to activate a write bitline or a writebar bitline based on input data received, wherein the appropriate bitline is activated when writing is enabled;
ground biased write control circuitry to bias the write and writebar bitlines to ground when the timing architecture circuitry indicates writing is not enabled;
ground biased read control circuitry to bias a read bitline to ground when the timing architecture circuitry indicates reading is not enabled; and
a data output latch to output data read from the memory cells when a latch enable signal is activated.

12. The apparatus of claim 11, wherein the timing architecture circuitry includes
a write enable latch to receive a signal indicating the apparatus is in write mode and to activate a write enable signal on a positive edge of a clock signal;
a write address decoder to receive a write address and to decode the write address and activate associated write wordlines on the positive edge of the clock signal;
low phase timing logic to activate write driver enable and write wordline enable signals during low phases of the clock while the apparatus is in write mode; and
write wordline activation circuitry to activate a write wordline based on the associated write wordline and the write wordline enable signal.

13. The apparatus of claim 11, wherein the timing architecture circuitry includes
a read enable latch to receive a signal indicating the apparatus is in read mode and to activate a read enable signal on a positive edge of a clock signal;
a read address decoder to receive a read address and to decode the read address and activate associated read wordlines on the positive edge of the clock signal; and
read wordline activation circuitry to activate a read wordline based on the associated read wordline and the read enable signal.

14. The apparatus of claim 11, wherein
the ground biased write control circuitry includes a first negative channel transistor coupled between the write bitline and ground and a second negative transistor coupled between the writebar bitline and ground; and
the ground biased read control circuitry includes a negative channel transistor coupled between the read bitline and ground.

15. The apparatus of claim 11, further comprising a write bitline keeper to maintain one of the write and writebar bitlines at a predetermined voltage during consecutive write cycles.

16. The apparatus of claim 15, wherein the write bitline keeper includes a first inverter and a first positive channel transistor coupled between the write bitline and a predetermined voltage node and a second inverter and a second positive channel transistor coupled between the writebar bitline and the predetermined voltage node.

17. The apparatus of claim 11, further comprising read bitline sense control circuitry to sense the value stored in the memory cell during read operations.

18. The apparatus of claim 17, wherein the read bitline sense control circuitry includes a positive transistor coupled between the read bitline and a predetermined voltage node.

19. The apparatus of claim 17, further comprising an inverter coupled between the read bitline sense control circuitry and the data output latch to trip if the signal read from the memory cell exceeds the threshold.

* * * * *